United States Patent
Berntson et al.

(10) Patent No.: US 10,943,795 B2
(45) Date of Patent: Mar. 9, 2021

(54) APPARATUS AND METHODS FOR CREATING A THERMAL INTERFACE BOND BETWEEN A SEMICONDUCTOR DIE AND A PASSIVE HEAT EXCHANGER

(71) Applicant: Indium Corporation, Utica, NY (US)

(72) Inventors: Ross B. Berntson, Utica, NY (US); James E. Hisert, Utica, NY (US); Robert N. Jarrett, Utica, NY (US); Jordan P. Ross, Utica, NY (US)

(73) Assignee: INDIUM CORPORATION, Utica, NY (US)

( * ) Notice: Subject to any disclaimer, the term of this patent is extended or adjusted under 35 U.S.C. 154(b) by 0 days.

(21) Appl. No.: 16/246,417

(22) Filed: Jan. 11, 2019

(65) Prior Publication Data

US 2019/0172727 A1 Jun. 6, 2019

Related U.S. Application Data (62) Division of application No. 15/833,982, filed on Dec. 6, 2017, now Pat. No. 10,607,857.

(51) Int. Cl.
*H01L 21/44* (2006.01)
*H01L 21/48* (2006.01)
(Continued)

(52) U.S. Cl.
CPC ........ *H01L 21/4882* (2013.01); *H01L 23/367* (2013.01); *H01L 23/3736* (2013.01); *H01L 33/64* (2013.01)

(58) Field of Classification Search
CPC ..... H01L 23/3736; H01L 24/33; H01L 23/42; H01L 2224/32225; H01L 2924/16251;
(Continued)

(56) References Cited

U.S. PATENT DOCUMENTS

| 6,388,203 | B1 * | 5/2002 | Rinne | C08F 8/44 |
| | | | | 174/261 |
| 6,624,060 | B2 * | 9/2003 | Chen | H01L 24/11 |
| | | | | 438/613 |

(Continued)

FOREIGN PATENT DOCUMENTS

| CN | 103131396 | 6/2013 |
| CN | 104218010 | 12/2014 |

(Continued)

OTHER PUBLICATIONS

International Search Report and Written Opinion dated Feb. 21, 2019 for International Application No. PCT/US2018/063494, filed Nov. 30, 2018.

(Continued)

*Primary Examiner* — Mary A Wilczewski
*Assistant Examiner* — Tsz K Chiu
(74) *Attorney, Agent, or Firm* — Sheppard, Mullin, Richter & Hampton LLP (57) ABSTRACT

A method of joining a semiconductor die to a passive heat exchanger can include applying a bond enhancing agent to a semiconductor device; creating an assembly that includes a thermal interface disposed on the semiconductor device such that a first major surface of the thermal interface material is in touching relation with the bond enhancing agent on the semiconductor device, and a heat exchanger disposed in touching relation with a second major surface of the thermal interface material; and reflowing the assembly such that the thermal interface bonds the heat exchanger to the semiconductor device. Embodiments can use the ability of indium to bond to a non-metallic surface to form the thermal interface, which may be enhanced by a secondary coating on either or both joining surfaces.

8 Claims, 9 Drawing Sheets

(51) Int. Cl.
*H01L 21/50* (2006.01)
*H01L 23/367* (2006.01)
*H01L 23/373* (2006.01)
*H01L 33/64* (2010.01)

(58) Field of Classification Search
CPC . H01L 2224/32245; H01L 2224/33181; H01L 23/3735; H01L 2224/73253; H01L 2224/16225; H01L 2924/16152; H01L 2924/01322–01327; G01P 15/00–18
See application file for complete search history.

(56) References Cited

U.S. PATENT DOCUMENTS

| | | | |
|---|---|---|---|
| 6,635,509 B1 * | 10/2003 | Ouellet | B81C 1/00333 438/106 |
| 6,746,896 B1 * | 6/2004 | Shi | B23K 35/3613 257/E21.503 |
| 6,969,639 B2 * | 11/2005 | Cho | B81B 7/0077 257/704 |
| 6,974,723 B2 | 12/2005 | Matayabas, Jr. et al. | |
| 7,023,089 B1 | 4/2006 | Lu | |
| 7,347,354 B2 | 3/2008 | Hurley et al. | |
| 7,482,197 B2 * | 1/2009 | Furman | H01L 21/4882 257/E21.023 |
| 7,955,900 B2 * | 6/2011 | Jadhav | H01L 23/3735 438/122 |
| 8,373,991 B2 | 2/2013 | Fann et al. | |
| 8,404,519 B2 | 3/2013 | Chrysler et al. | |
| 8,617,926 B2 | 12/2013 | Su et al. | |
| 8,642,386 B2 | 2/2014 | Lu | |
| 8,896,110 B2 | 11/2014 | Hu et al. | |
| 9,252,054 B2 | 2/2016 | Wu | |
| 9,330,999 B2 | 5/2016 | Fitzgerald | |
| 9,899,293 B2 | 2/2018 | Groothuis | |
| 2002/0006681 A1 * | 1/2002 | Yamanaka | C30B 29/06 438/29 |
| 2004/0200879 A1 * | 10/2004 | Lewis | B23K 35/3066 228/56.3 |
| 2005/0280142 A1 * | 12/2005 | Hua | H01L 23/3736 257/707 |
| 2006/0033205 A1 | 2/2006 | Sauciuc et al. | |
| 2006/0273450 A1 | 12/2006 | Shi | |
| 2007/0001310 A1 | 1/2007 | Hua et al. | |
| 2007/0231967 A1 | 10/2007 | Jadhav et al. | |
| 2008/0080144 A1 | 4/2008 | Machiroutu | |
| 2008/0239660 A1 | 10/2008 | Mustapha et al. | |
| 2009/0267479 A1 * | 10/2009 | Hutchison | H01J 1/304 313/309 |
| 2011/0049702 A1 | 3/2011 | Negoro | |
| 2011/0096507 A1 | 4/2011 | Deram | |
| 2011/0308782 A1 * | 12/2011 | Merrill | C09K 5/08 165/185 |
| 2012/0055612 A1 | 3/2012 | Ahmed et al. | |
| 2014/0138817 A1 | 5/2014 | Paek | |
| 2014/0160673 A1 | 6/2014 | Sauciuc | |
| 2014/0170434 A1 * | 6/2014 | Hassan | G02B 1/10 428/552 |
| 2014/0264820 A1 | 9/2014 | Hu et al. | |
| 2016/0155682 A1 | 6/2016 | Ahuja | |
| 2017/0103962 A1 | 4/2017 | Oomae | |
| 2017/0186667 A1 | 6/2017 | Choudhury | |
| 2018/0090417 A1 | 3/2018 | Gutala | |
| 2018/0237668 A1 | 8/2018 | Mizori | |
| 2018/0254234 A1 | 9/2018 | Limaye | |

FOREIGN PATENT DOCUMENTS

| | | |
|---|---|---|
| CN | 205912413 | 1/2017 |
| KR | 10-2007-0007192 | 1/2007 |
| WO | WO 2005/122252 | 12/2005 |

OTHER PUBLICATIONS

Office Action dated Aug. 24, 2020 for Korean Application No. 10-2020-7019219, filed Jul. 2, 2020.
Malaysian Substantive Examination Clear Report dated Sep. 18, 2020 for Malaysian Application No. PI2020002884, filed Nov. 30, 2018.
Office Action dated Oct. 28, 2020 for Chinese Application No. 2018800788745.
Korean Office Action dated Dec. 26, 2020 for Korean Application No. 10-2020-7019219.

\* cited by examiner

Fig. 1
(Conventional)

Fig. 2
(Conventional)

APPARATUS AND METHODS FOR CREATING A THERMAL INTERFACE BOND BETWEEN A SEMICONDUCTOR DIE AND A PASSIVE HEAT EXCHANGER

CROSS REFERENCE TO RELATED APPLICATIONS

This application is a divisional of U.S. patent application Ser. No. 15/833,982, filed Dec. 6, 2017, titled "SEMICONDUCTOR DEVICE ASSEMBLY INCLUDING A THERMAL INTERFACE BOND BETWEEN A SEMICONDUCTOR DIE AND A PASSIVE HEAT EXCHANGER," and issued as U.S. Pat. No. 10,607,857 on Mar. 31, 2020. The content of which is incorporated herein by reference in its entirety.

TECHNICAL FIELD

The disclosed technology relates generally to assembly systems and methods for circuits. More particularly, some embodiments relate to apparatus and methods for joining a semiconductor die to a passive heat exchanger.

DESCRIPTION OF THE RELATED ART

The dissipation of heat is a key to maintaining longevity and reliability of semiconductor and power devices. As semiconductor devices decrease in size and increase in performance, heat exchangers or heat sinks (sometimes also referred to as heat spreaders or lids) have become more common in various applications to provide a mechanism for heat dissipation. Thermal interface materials are commonly used between the heat-producing semiconductor device and its associated heatsink. Thermal interface materials can be used to provide a more efficient and reliable conduction of heat from the device to the heatsink. Common thermal interface materials are metal-based, which means they have a very high conductivity as compared to polymer-based thermal interface materials.

Indium metal is often used as a thermal interface material due to a combination of properties: 1) relatively high thermal conductivity compared to competing thermal interface materials, 2) a low flow-stress/high degree of malleability, 3) acceptable mechanical strength for this type of application without an external mechanical fixturing mechanism, and 4) it is a solid material that will not move outside the bond area or develop air pockets during normal use. Indium's ductility and thermal conductivity make it ideal as a compressible thermal interface material.

A traditional thermal interface that uses indium metal requires the semiconductor die to have a backside metallization. This metallization is typically made up of three parts: 1) a reactive layer, 2) a barrier layer, and 3) a passivation layer. A common metallization for the backside of an integrated circuit may be, for example, titanium, nickel, and gold (from die surface, respectively), although many other materials can be used to provide the same or similar functions.

Indium will bond to non-metallic surfaces such as the silicon dioxide surface of a semiconductor die. It's bond strength to non-metals is high enough to provide desired mechanical attachment, but elevated process temperatures and the required scrubbing of the indium material on the die are not currently feasible with these components.

Figure 1:
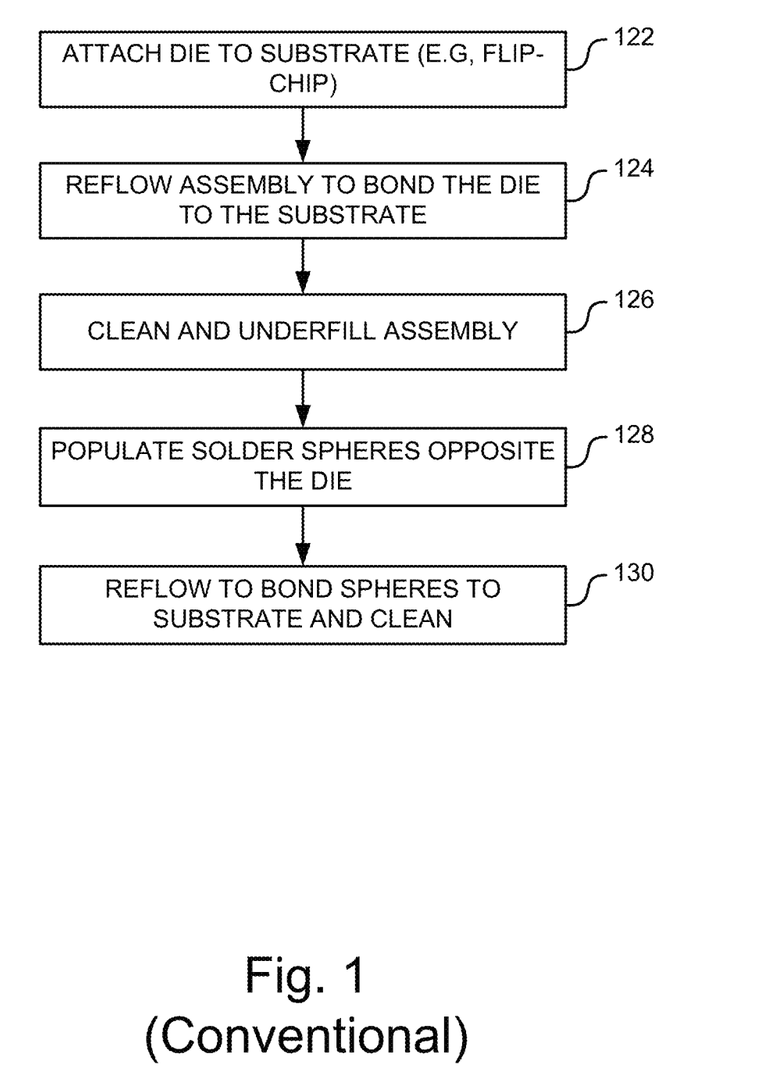
FIG. 1 is a diagram illustrating an example process for semiconductor die processing.

FIG. 1 is a diagram illustrating an example process for semiconductor die processing. Referring now to FIG. 1, in this example at operation 122 the die is attached to the substrate such as by attachment through I/Os on the active service of the die. For example, the die can be attached to the substrate in a flip-chip attachment process. Then, at operation 124 the assembly is re-flowed to bond the die to the package substrate. The assembly can then be cleaned and at operation 126 under filled such as by under filling with a specialized polymer. At operation 128, solder spheres are disposed on the side of the substrate opposite the semiconductor die so that the substrate can be joined to the circuit board. Accordingly, at operation 130 the package is reflowed, this time to bond the spheres to the substrate. The assembly can then be cleaned and is ready for use.

Figure 2:
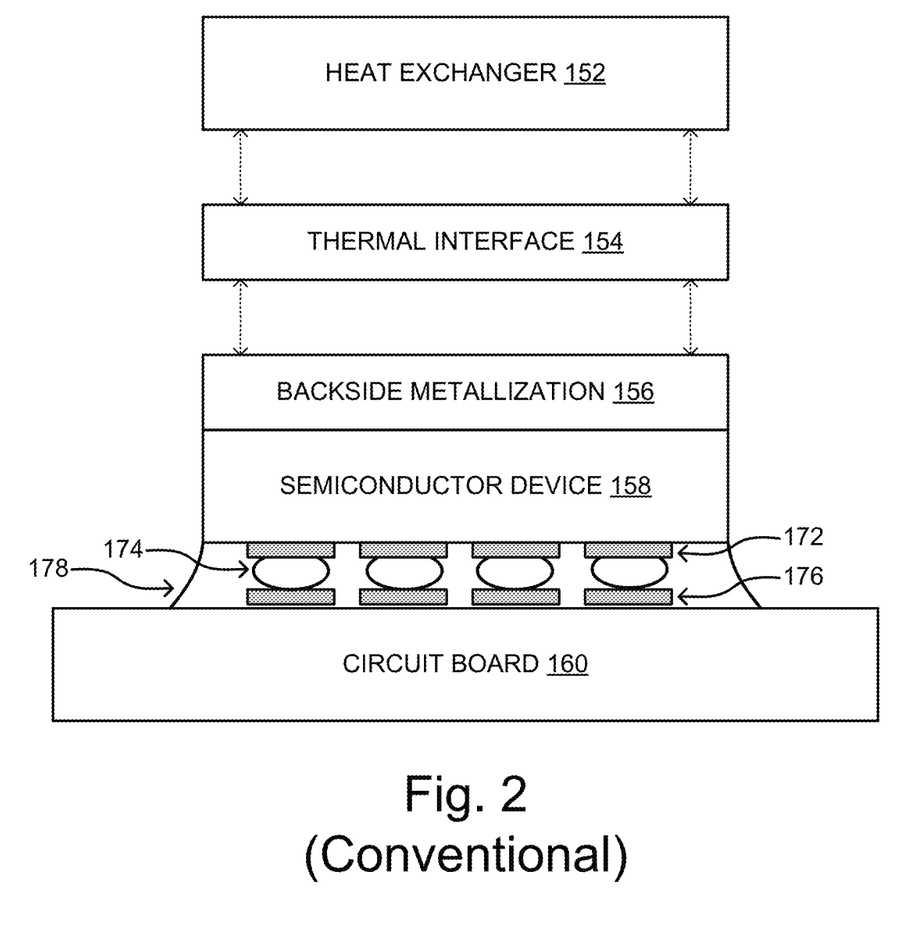
FIG. 2 illustrates an example of an assembly mounted onto a circuit board.

FIG. 2 illustrates an example of an assembly mounted onto a circuit board. In this example, semiconductor device 158 is mounted to circuit board 160. Particularly, solder spheres 174 were placed on metallized pads 172 of the semiconductor device 158 and reflowed to electrically connect metallized pads 172 two the electrical connectors 176 of the printed circuit board. 178 illustrates the underfill applied between the semiconductor device 158 and circuit board 160. This example further shows that backside metallization 156 is applied to semiconductor device 158 so that thermal interface 154 can be bonded to semiconductor device 158. Heat exchanger 152 is joined to semiconductor device 158 with thermal interface 154.

BRIEF SUMMARY OF EMBODIMENTS

Disclosed is a novel method of joining a semiconductor die to a passive heat exchanger. This method uses the ability of indium to bond to a non-metallic surface to form the thermal interface. Bonding is enhanced by a secondary coating on either (or both) joining surfaces. Joining surfaces in this case are typically an integrated circuit (IC) and a passive heat exchanger, commonly referred to as an integrated heat sink, a heat spreader, or a lid.

In one embodiment, a method for bonding a semiconductor device to a heat exchanger may include: providing a semiconductor device; applying a bond enhancing agent to a first surface of the semiconductor device; creating an assembly and reflowing the assembly such that the thermal interface bonds the heat exchanger to the semiconductor device. The assembly may include in various embodiments a thermal interface having a first major surface and a second major surface opposite the first major surface, wherein the thermal interface is disposed on the semiconductor device such that the first major surface of the thermal interface material is in touching relation with the bond enhancing agent on the semiconductor device; and a heat exchanger disposed in touching relation with the second major surface of the thermal interface material. In various embodiments the thermal interface can include an indium metal, and the bond enhancing agent can include at least one of a an organotitanate, and an organozirconate.

The bond enhancing agent can include an oxide seed layer deposited by applying a bulk liquid metal to the semiconductor device and removing the bulk liquid metal to leave the oxide seed layer. The oxide seed layer may be alloyed with the thermal interface to form a solid alloy.

The semiconductor device may be bonded to the heat exchanger without using a separate metallization layer to bond the thermal interface to the semiconductor device. The method may also include applying a bond enhancing agent to a surface of the heat exchanger that is to be disposed in touching relation with the second major surface of the thermal interface material.

In other embodiments, a semiconductor device assembly may include: a semiconductor device; a bond enhancing agent disposed on a first surface of the semiconductor device; a thermal interface disposed on the first surface of the semiconductor device that may include a first major surface and a second major surface opposite the first major surface; wherein the thermal interface is disposed on the semiconductor device such that the first major surface of the thermal interface material is in touching relation with the bond enhancing agent on the semiconductor device; and a heat exchanger disposed on the thermal interface in touching relation with the second major surface of the thermal interface.

The thermal interface can include an indium metal, and in some embodiments the bond enhancing agent can include at least one of an organotitanate, and an organozirconate. In other embodiments, the bond enhancing agent can include an oxide seed layer deposited, for example, by applying a bulk liquid metal to the semiconductor device and removing the bulk liquid metal to leave the oxide seed layer. Liquid alloys that can be used to create an oxide seed layer can include, for example, alloys comprising indium, gallium, or a combination of indium and gallium; the foregoing with the addition of tin in some cases. Examples of alloys can include the Indalloy® alloys available from the Indium Corporation. The oxide seed layer may be alloyed with the thermal interface to form a solid alloy.

The semiconductor device may be bonded to the heat exchanger without using a separate metallization layer to bond the thermal interface to the semiconductor device. The heat exchanger can include a heat sink, a heat spreader, or a lid Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

According to various embodiments of the disclosed technology, indium can be bonded to a non-metallic surface of a semiconductor device to form a thermal interface. In some embodiments, this bonding can be enhanced by applying a secondary coating on either or both joining surfaces of the semiconductor die (e.g., an integrated circuit or other semiconductor device) and its respective heat exchanger.

In some embodiments, a bond enhancing agent is used to promote the wetting or cold welding of the indium thermal interface to the semiconductor device. The bond enhancing agent can include, for example, a liquid metal that is capable of wetting to the bare semiconductor device and provides a seed layer for the indium. The bulk liquid metal can be removed, leaving an oxide seed layer which, when alloyed with indium through the reflow, would result in a remaining alloy that is a solid similar to pure indium. As another example, an organotitanate or organozirconate, or other like materials, could be sprayed or otherwise deposited onto the bare die surface, which would promote the bonding of indium to the bare die. In another example, a silver-filled polymer adhesive could be sprayed or otherwise deposited onto the bare die surface.

Figure 3:
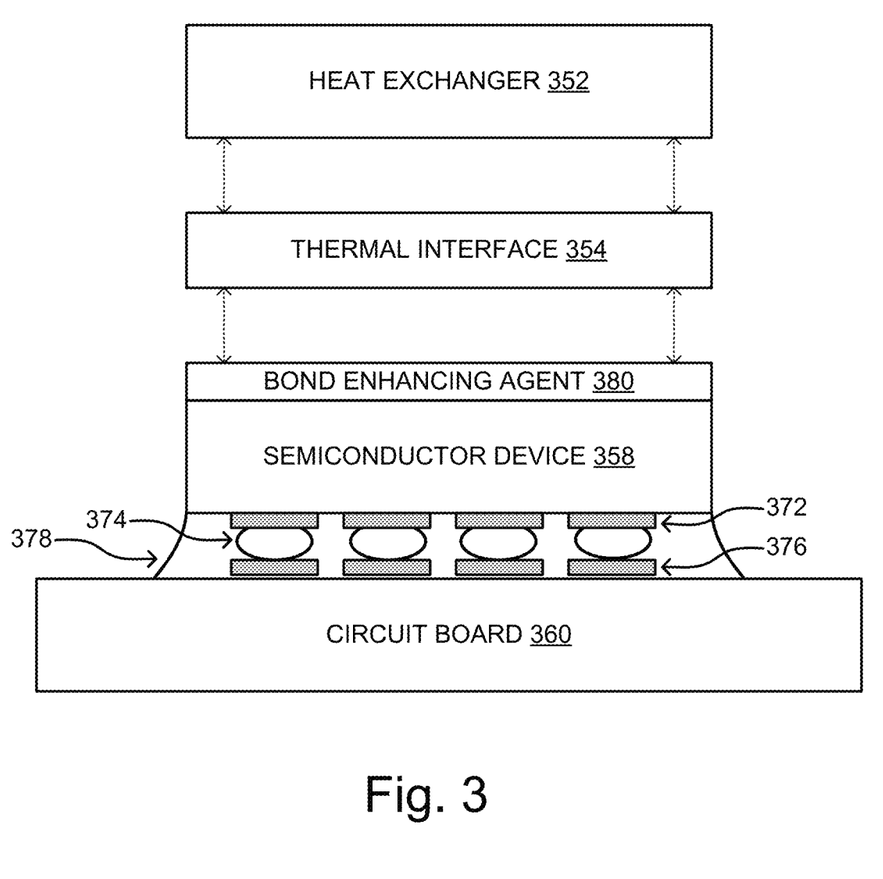
FIG. 3 is a diagram illustrating an example configuration using a bond enhancing agent in accordance with one embodiment of the technology described herein.
Figure 4:
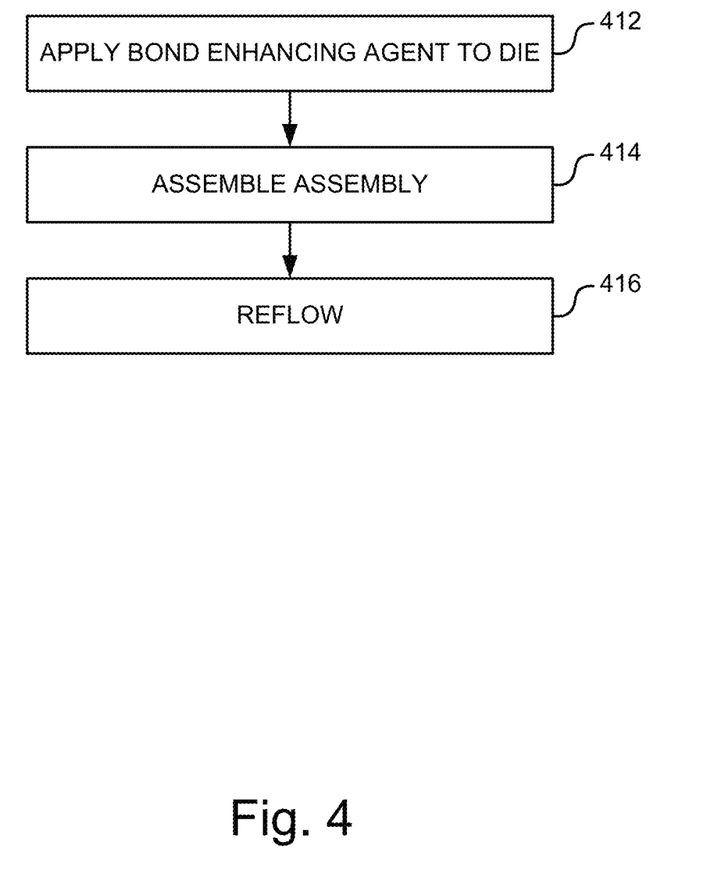
FIG. 4 is a diagram illustrating an example process for applying a thermal interface in accordance with one embodiment of the technology described herein.
Figure 5:
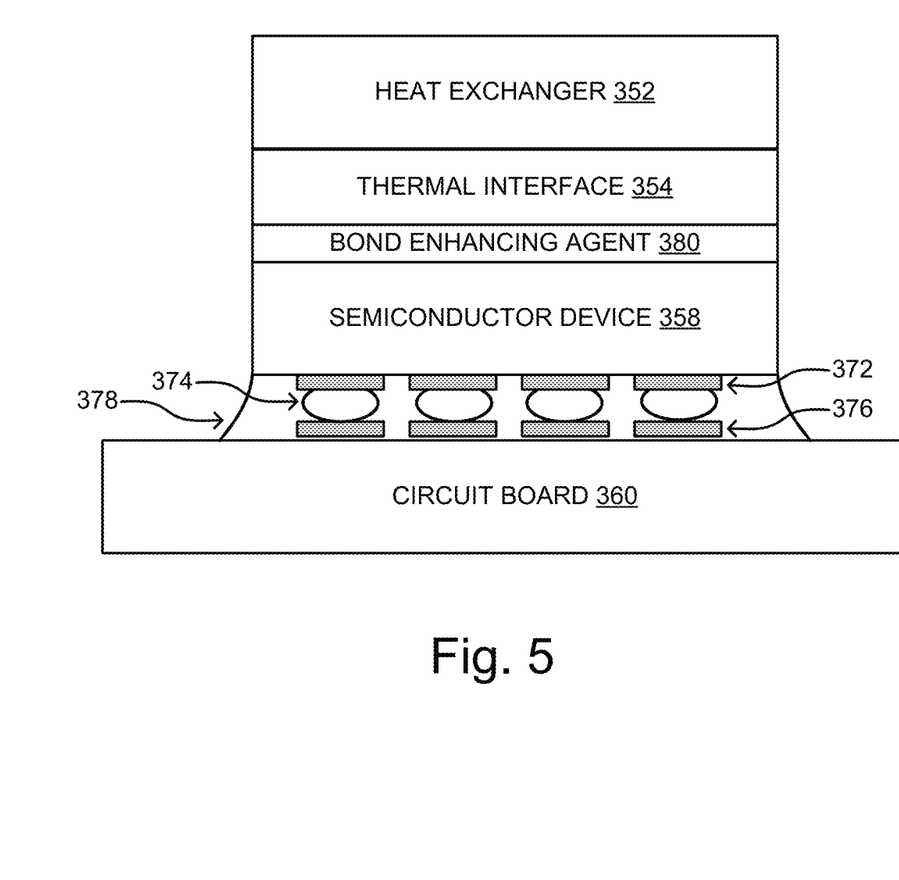
FIG. 5 is a diagram illustrating an example of an assembly assembled into its final configuration with a bond enhancing agent disposed on a semiconductor device between the thermal interface material and the semiconductor device in accordance with one embodiment of the technology described herein.

FIG. 3 is a diagram illustrating an example configuration using a bond enhancing agent in accordance with one embodiment of the technology described herein. FIG. 4 is a diagram illustrating an example process for applying a thermal interface in accordance with one embodiment of the technology described herein. With reference now to FIGS. 3 and 4, in this example, at operation 412 a bond enhancing agent 380 is applied to the semiconductor die 358. In this example, bond enhancing agent 380 is applied directly to the surface of semiconductor die 358 to which the thermal interface 354 is to be mounted. As noted above, bond enhancing agent 380 can be used to promote the wetting or cold welding of the thermal interface 354 (e.g., and indium metal thermal interface) to the surface of semiconductor device 358. At operation 414, the assembly can be assembled into its final configuration, an example of which is shown in FIG. 5, and at operation 416, the assembly can be reflowed to melt the thermal interface and secure heat exchanger 352 to semiconductor device 358.

Figure 6:
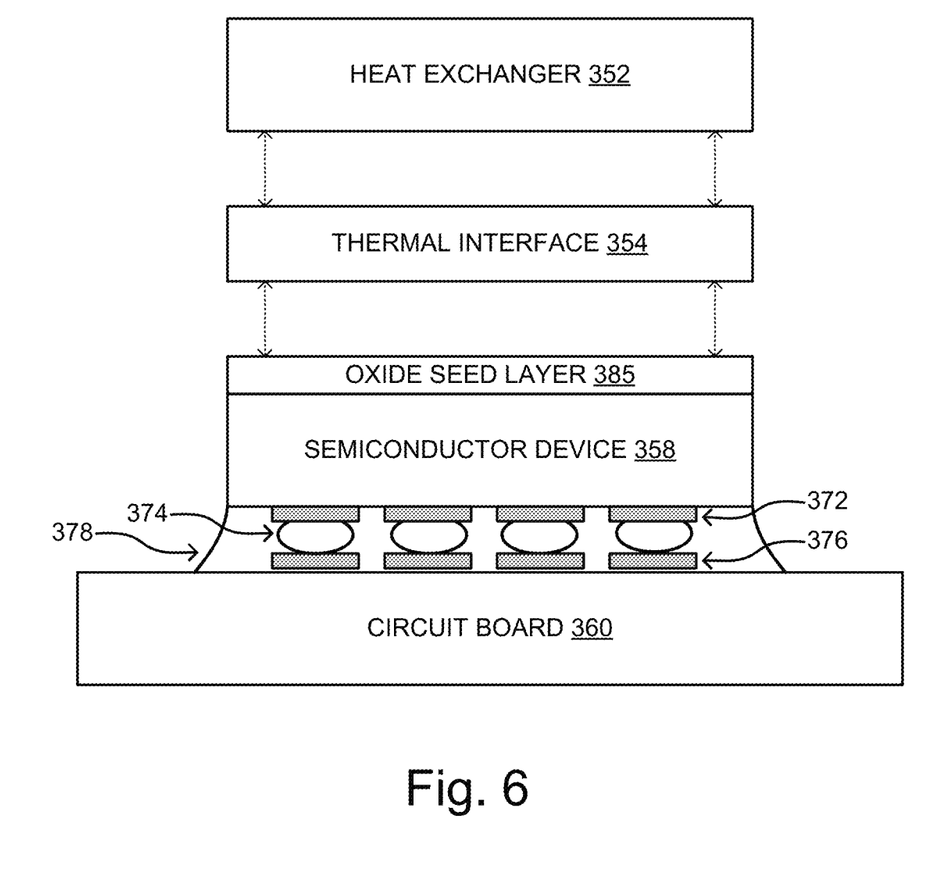
FIG. 6. Illustrates an example in which an oxide seed layer is deposited on semiconductor device in accordance with one embodiment of the technology described herein.
Figure 7:
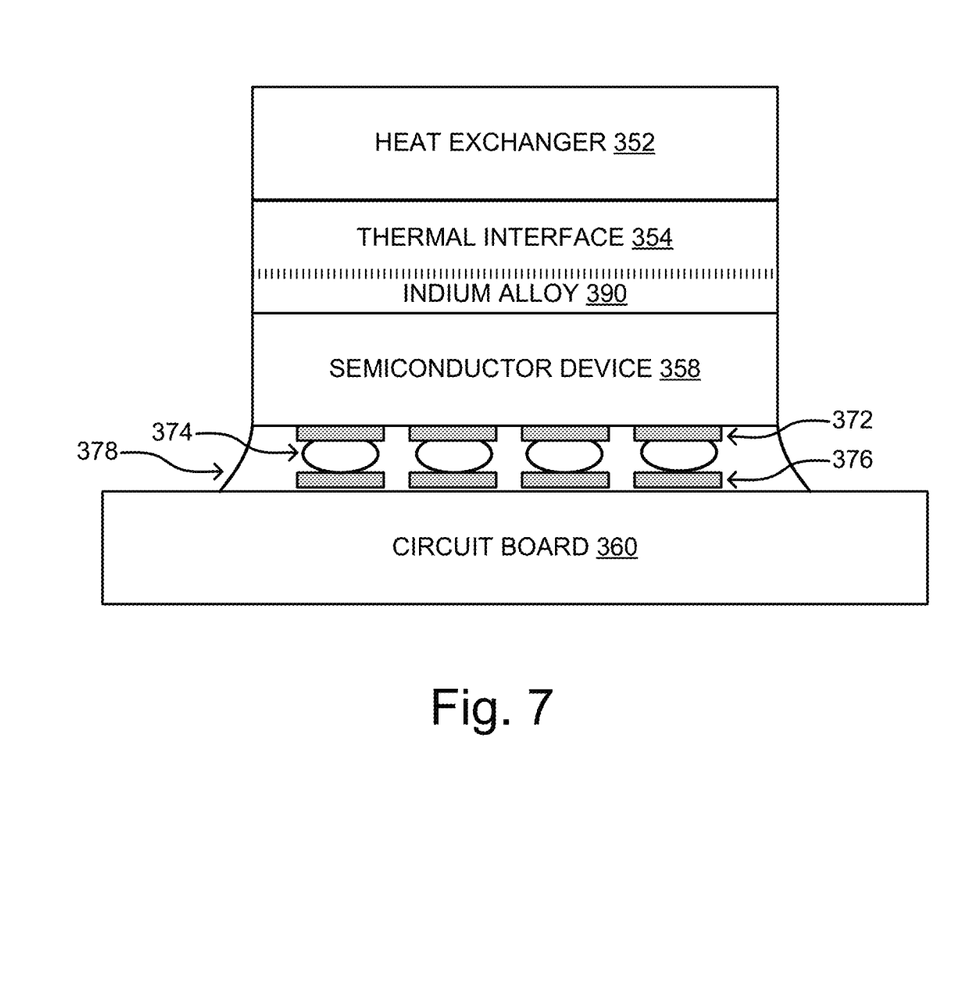
FIG. 7 illustrates the formation of an indium alloy from the oxide seed layer as a result of a reflow operation in accordance with one embodiment of the technology described herein.

As noted above, in some embodiments, the bond enhancing agent (e.g., agent 380) can be a bulk liquid metal that is applied and removed to leave an oxide seed layer which is alloyed with indium through reflow. FIG. 6. Illustrates an example of this in which an oxide seed layer 385 is deposited on semiconductor device 358 using this process. FIG. 7 illustrates the formation of an indium alloy 390 as a result of the reflow operation. Liquid metals that can be used to create an oxide seed layer can include, for example, alloys comprising indium, gallium, or a combination of indium and gallium; the foregoing with the addition of tin in some cases. Examples of alloys can include the Indalloy® alloys available from the Indium Corporation.

Figure 8:
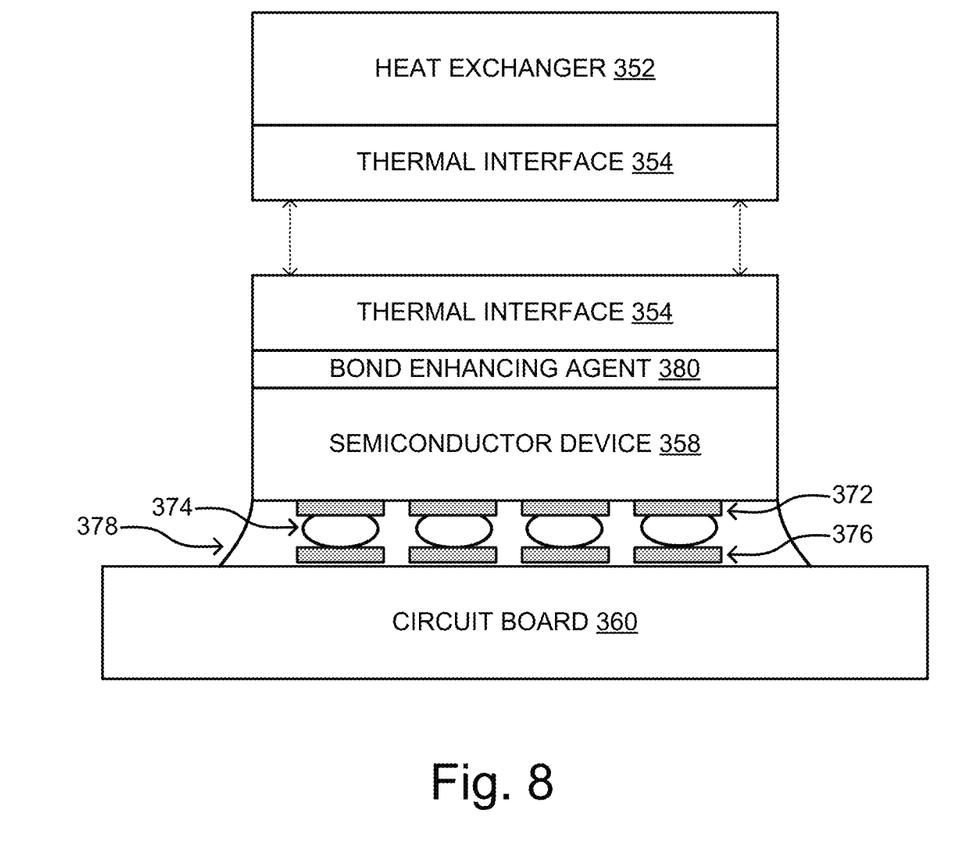
FIG. 8 illustrates an example in which the thermal interface material is applied separately to both joining surfaces in accordance with one embodiment of the technology described herein.

Due to the ability of indium to cold weld, indium can be applied on both joining surfaces either separately or at the same time. An example of this is shown at FIG. 8, in which the thermal interface is applied separately to both surfaces. In particular, in this example, thermal interface 354 is applied both to heat exchanger 352 and two semiconductor device 358. If the thermal interface is applied separately, the parts can be assembled in a separate step, and may or may not be reflowed to create a homogeneous joint from the two separate indium layers.

Figure 9:
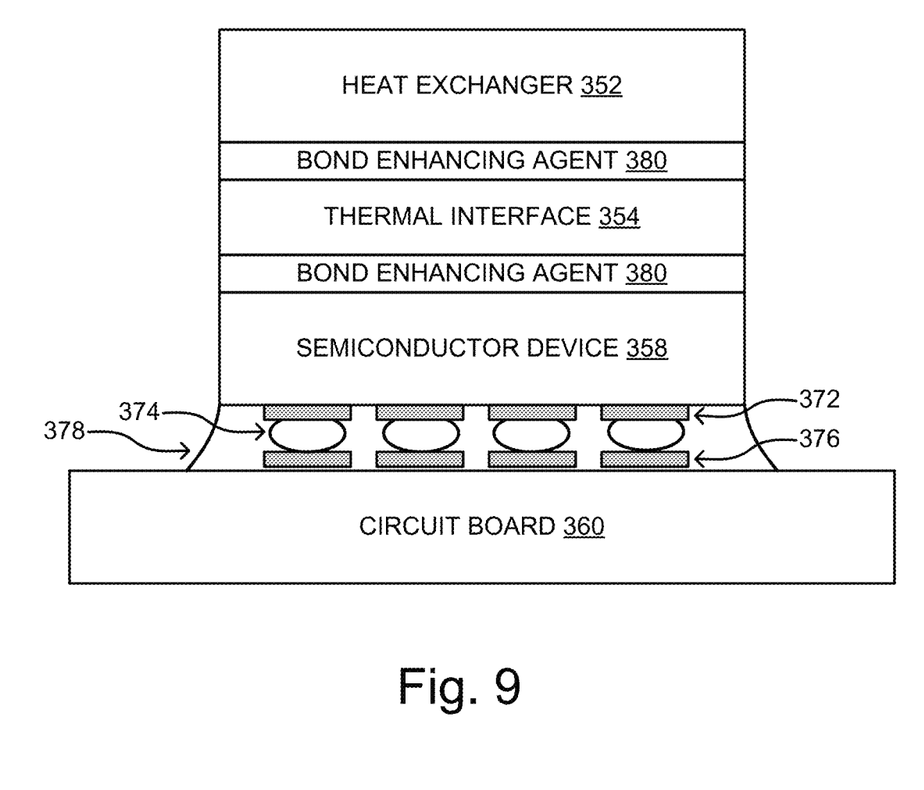
FIG. 9 illustrates an example in which a bond enhancing agent is applied to both the semiconductor device and heat exchanger prior to assembly.

It is noted that in further embodiments, the bond enhancing agent (e.g. bond enhancing agent 380) may be applied to both the semiconductor device 358 and heat exchanger 352 to facilitate bonding of the thermal interface 354 to both components. FIG. 9 illustrates an example of this in which a bond enhancing agent 380 is applied to both the semiconductor device 358 and heat exchanger 352 prior to assembly.

As the foregoing examples illustrate, embodiments can be provided that enhance the ability of indium to bond to non-metals (such as, e.g., a semiconductor surface) at traditional reflow temperatures. Depending on the application, these temperatures can be within a range of approximately 190° C. 210° C. In some applications, these temperatures are approximately 200° C. Accordingly, embodiments may be implemented that can yield benefits over conventional processes. These benefits may include, for example, the elimination of resources used for backside die/wafer metallization, flux application or the curing process.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method for bonding a semiconductor device to a heat exchanger, comprising:
   providing a semiconductor device;
   forming an oxide seed layer on a first surface of the semiconductor device by:
      applying a bond enhancing agent comprising a bulk liquid metal to a first surface of the semiconductor device; and
      removing the bulk liquid metal to leave the oxide seed layer on the first surface of the semiconductor device;
   creating an assembly comprising:
      a thermal interface comprising a first major surface and a second major surface opposite the first major surface, wherein the thermal interface is disposed on the semiconductor device such that the first major surface of the thermal interface is in touching relation with the oxide seed layer; and a heat exchanger disposed in touching relation with the second major surface of the thermal interface; and wherein, the oxide seed layer alloys with the thermal interface and connects the semiconductor device to the thermal interface.

2. The method of claim 1, wherein the thermal interface comprises an indium metal.

3. The method of claim 1, wherein the bond enhancing agent comprises at least one of a an organotitanate, and an organozirconate.

4. The method of claim 1, wherein the semiconductor device is bonded to the heat exchanger without using a separate metallization layer to bond the thermal interface to the semiconductor device.

5. The method of claim 1, wherein the heat exchanger comprises a heat sink, a heat spreader, or a lid.

6. The method of claim 1, further comprising applying a bond enhancing agent to a surface of the heat exchanger that is to be disposed in touching relation with the second major surface of the thermal interface.

7. The method of claim 1, wherein the liquid metal comprises gallium.

8. The method of claim 1, wherein the liquid metal comprises indium and gallium.

* * * * *